(12) United States Patent
Huang et al.

(10) Patent No.: US 12,062,567 B2
(45) Date of Patent: Aug. 13, 2024

(54) SYSTEMS AND METHODS FOR SUBSTRATE SUPPORT TEMPERATURE CONTROL

(71) Applicant: Applied Materials, Inc., Santa Clara, CA (US)

(72) Inventors: Zubin Huang, Santa Clara, CA (US); Rui Cheng, San Jose, CA (US); Diwakar Kedlaya, San Jose, CA (US); Satish Radhakrishnan, San Jose, CA (US); Anton V. Baryshnikov, Santa Clara, CA (US); Venkatanarayana Shankaramurthy, Santa Clara, CA (US); Karthik Janakiraman, San Jose, CA (US); Paul L. Brillhart, Santa Clara, CA (US); Badri N. Ramamurthi, Los Gatos, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 451 days.

(21) Appl. No.: 16/844,764

(22) Filed: Apr. 9, 2020

(65) Prior Publication Data

US 2021/0320027 A1    Oct. 14, 2021

(51) Int. Cl.
*H01L 21/683*  (2006.01)
*H01J 37/32*  (2006.01)
*H01L 21/67*  (2006.01)

(52) U.S. Cl.
CPC .... *H01L 21/6838* (2013.01); *H01J 37/32724* (2013.01); *H01L 21/67017* (2013.01); *H01L 21/67167* (2013.01); *H01L 21/67253* (2013.01); *H01J 2237/186* (2013.01); *H01J 2237/24585* (2013.01)

(58) Field of Classification Search
CPC .......... H01L 21/6838; H01L 21/67017; H01L 21/67167; H01L 21/67253; H01L 21/67754; H01J 37/32724; H01J 2237/186; H01J 2237/24585
See application file for complete search history.

(56) References Cited

U.S. PATENT DOCUMENTS 6,001,180 A * 12/1999 Inoue ................. H01L 21/6838
                                                            211/41.18
6,135,054 A * 10/2000 Inoue .................... C23C 16/325
                                                            118/728
7,292,426 B2 * 11/2007 Ito ......................... H01L 21/683
                                                            361/234

(Continued)

FOREIGN PATENT DOCUMENTS

CN      114999987 A  *  9/2022
JP      2001189376 A  *  7/2001  ............. G03F 7/707
JP      2022134074 A  *  9/2022

*Primary Examiner* — Jarrett J Stark
(74) *Attorney, Agent, or Firm* — Kilpatrick Townsend & Stockton LLP (57) ABSTRACT

Exemplary methods of semiconductor processing may include coupling a fluid conduit within a substrate support in a semiconductor processing chamber to a system foreline. The coupling may vacuum chuck a substrate with the substrate support. The methods may include flowing a gas into the fluid conduit. The methods may include maintaining a pressure between the substrate and the substrate support at a pressure higher than the pressure at the system foreline.

14 Claims, 6 Drawing Sheets

(56) References Cited

U.S. PATENT DOCUMENTS

| | | | |
|---|---|---|---|
| 2004/0163590 A1* | 8/2004 | Tran | C23C 16/52 |
| | | | 118/715 |
| 2006/0005856 A1* | 1/2006 | Sun | H01J 37/32357 |
| | | | 134/1.1 |
| 2006/0134330 A1* | 6/2006 | Ishikawa | G05B 19/41825 |
| | | | 427/248.1 |
| 2009/0235866 A1* | 9/2009 | Kataigi | H01L 21/6875 |
| | | | 118/725 |
| 2011/0281376 A1* | 11/2011 | Amano | H01L 21/6708 |
| | | | 156/345.24 |
| 2015/0311108 A1* | 10/2015 | Horiuchi | H01L 21/6875 |
| | | | 269/302 |
| 2016/0036355 A1* | 2/2016 | Moriya | H01L 21/6831 |
| | | | 361/234 |
| 2018/0171473 A1* | 6/2018 | Agarwal | H01L 21/68764 |
| 2018/0308737 A1* | 10/2018 | Moriya | H01L 21/68742 |
| 2019/0049849 A1* | 2/2019 | Chen | G03F 1/42 |
| 2021/0074574 A1* | 3/2021 | Ji | H01L 21/68735 |
| 2021/0190219 A1* | 6/2021 | Shiomura | G03F 7/707 |
| 2021/0320027 A1* | 10/2021 | Huang | H01L 21/67017 |

\* cited by examiner

SYSTEMS AND METHODS FOR SUBSTRATE SUPPORT TEMPERATURE CONTROL

TECHNICAL FIELD

The present technology relates to semiconductor deposition processes. More specifically, the present technology relates to systems and methods for controlling temperature profiles for substrate supports.

BACKGROUND

Integrated circuits are made possible by processes which produce intricately patterned material layers on substrate surfaces. Producing patterned material on a substrate requires controlled methods of formation and removal of exposed material. As device sizes continue to shrink, material uniformity may affect subsequent operations. For example, the temperature non-uniformity of a substrate heater may affect subsequent deposition film thickness uniformity.

Thus, there is a need for improved systems and methods that can be used to produce high quality devices and structures. These and other needs are addressed by the present technology.

SUMMARY

Exemplary methods of semiconductor processing may include coupling a fluid conduit within a substrate support in a semiconductor processing chamber to a system foreline. The coupling may vacuum chuck a substrate with the substrate support. The methods may include flowing a gas into the fluid conduit. The methods may include maintaining a pressure between the substrate and the substrate support at a pressure higher than the pressure at the system foreline.

In some embodiments, coupling the fluid conduit to the system foreline may include actuating a valve between the fluid conduit and the system foreline to form a vacuum in the fluid conduit. The methods may include forming a vacuum within the semiconductor processing chamber to provide a processing pressure. The pressure between the substrate and the substrate support may be between the pressure at the system foreline and the processing pressure. The pressure between the substrate and the substrate support may be maintained between about 1 Torr and about 30 Torr. A manometer may be coupled in the fluid conduit proximate the semiconductor processing chamber. The manometer may be communicatively coupled with a controller configured to control a flow rate of the gas being flowed into the fluid conduit.

The methods may include adjusting a flow rate of the gas being flowed into the fluid conduit to maintain a pressure setpoint at the manometer. The controller may include a mass flow controller coupled with an inert gas source. The substrate support may define a plurality of protrusions extending from a first surface of the substrate support. The substrate may be seated on the plurality of protrusions. The protrusions may extend from the first surface of the substrate support to a similar height, and the first surface of the substrate support may be characterized by a raised portion creating a reduced gap height between protrusions within the raised portion of the first surface of the substrate support. The raised portion may be located at a central region of the substrate support. The raised portion may include an annular region located radially outward of a center of the substrate support.

Some embodiments of the present technology may encompass semiconductor processing systems including a semiconductor processing chamber. The systems may include a foreline fluidly coupling the semiconductor processing chamber with a pump. The systems may include a substrate support disposed within the semiconductor processing chamber. The substrate support may be characterized by a first surface configured to contact a substrate. The first surface may define an aperture through the substrate support. The systems may include a shaft extending from the substrate support and providing fluid access to the aperture defined through the substrate support. The systems may include a fluid line extending from the shaft to a pressure controller. The fluid line may be fluidly accessible between the semiconductor processing chamber and the foreline. The systems may include a gas injection line fluidly coupling a gas source with the fluid line. The pressure controller may be configured to deliver gas from the gas source through the gas injection line into the fluid line.

In some embodiments, a manometer may be coupled in the fluid line proximate the semiconductor processing chamber. The substrate support may define a plurality of protrusions extending from the first surface of the substrate support. The plurality of protrusions may be configured to support the substrate. The protrusions may extend from the first surface of the substrate support to a similar height. The first surface of the substrate support may be characterized by a raised portion creating a reduced gap height between protrusions within the raised portion of the first surface of the substrate support. The raised portion may be located at a central region of the substrate support. The raised portion may be a first raised portion, and the first surface of the substrate support may be characterized by a second raised portion including an annular region located radially outward of the central region of the substrate support.

Some embodiments of the present technology encompass methods of semiconductor processing. The methods include coupling a fluid conduit within a substrate support in a semiconductor processing chamber to a system foreline. The coupling may vacuum chuck a substrate with the substrate support. The substrate support may define a plurality of protrusions extending from a first surface of the substrate support, and the substrate may be seated on the plurality of protrusions. The methods may include forming a vacuum within the semiconductor processing chamber to provide a processing pressure. The methods may include flowing a gas into the fluid conduit. The methods may include maintaining a pressure between the substrate and the substrate support that is between the pressure at the system foreline and the processing pressure.

Such technology may provide numerous benefits over conventional systems and techniques. For example, by maintaining a backside pressure with the substrate, improved temperature control may be afforded. Additionally, by adjusting the protrusion gap height along the substrate, additional substrate temperature control may be provided. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

During semiconductor fabrication, structures may be produced on a substrate utilizing a variety of deposition and etching operations. A substrate support may hold and heat the substrate for processing. The substrate support may be embedded with heating elements. A number of aspects of a processing chamber may impact deposition including substrate support construction, the substrate support materials, the heating elements, the heating element design, chamber flow profile, among a number of other features. This may produce a non-uniform temperature profile or processing profile on the substrate, and may lead to a substrate being deposited with a non-uniform film thickness during a deposition operation. For example, some deposition processes may be temperature sensitive, and a substrate temperature increase of one degree Celsius may result in a corresponding increase in deposition thickness. Because temperature non-uniformity may occur in any number of patterns on a substrate, a number of deposition profiles may be formed on the substrate, including center high, edge high, middle high, or some combination or other profile variation. As device sizes continue to reduce and film thicknesses on semiconductor substrates are on the nanometer scale or less, even small temperature differences within the substrate from the substrate support may influence film deposition onto the substrate.

The present technology may overcome these limitations by controlling a substrate backside pressure during vacuum chucking. Some substrate supports according to embodiments of the present technology may include protrusions across the substrate support, and on which the substrate may be seated. An amount of inert or non-reactive gas may exist about gaps between the protrusions between the substrate and the surface of the substrate support. By increasing a pressure over conventional technologies, an increase in gas molecules may be provided, which may increase a molecular mass within the volume, and which may better conduct heat delivered by the substrate support. This may facilitate a more uniform temperature profile or a more controlled temperature profile, which may reduce or limit film thickness non-uniformity during deposition. Additionally, by adjusting the gap distance for protrusions at specific locations within the pedestal, deposition characteristics, such as increased regional deposition, may be better controlled, and may be adjusted to reverse non-uniformity produced in conventional processes. After describing general aspects of a chamber according to embodiments of the present technology in which plasma processing operations discussed below may be performed, specific methodology and component configurations may be discussed. It is to be understood that the present technology is not intended to be limited to the specific components and processing discussed, as the techniques described may be used to improve a number of film formation or removal processes, and may be applicable to a variety of processing chambers and operations.

Figure 1:
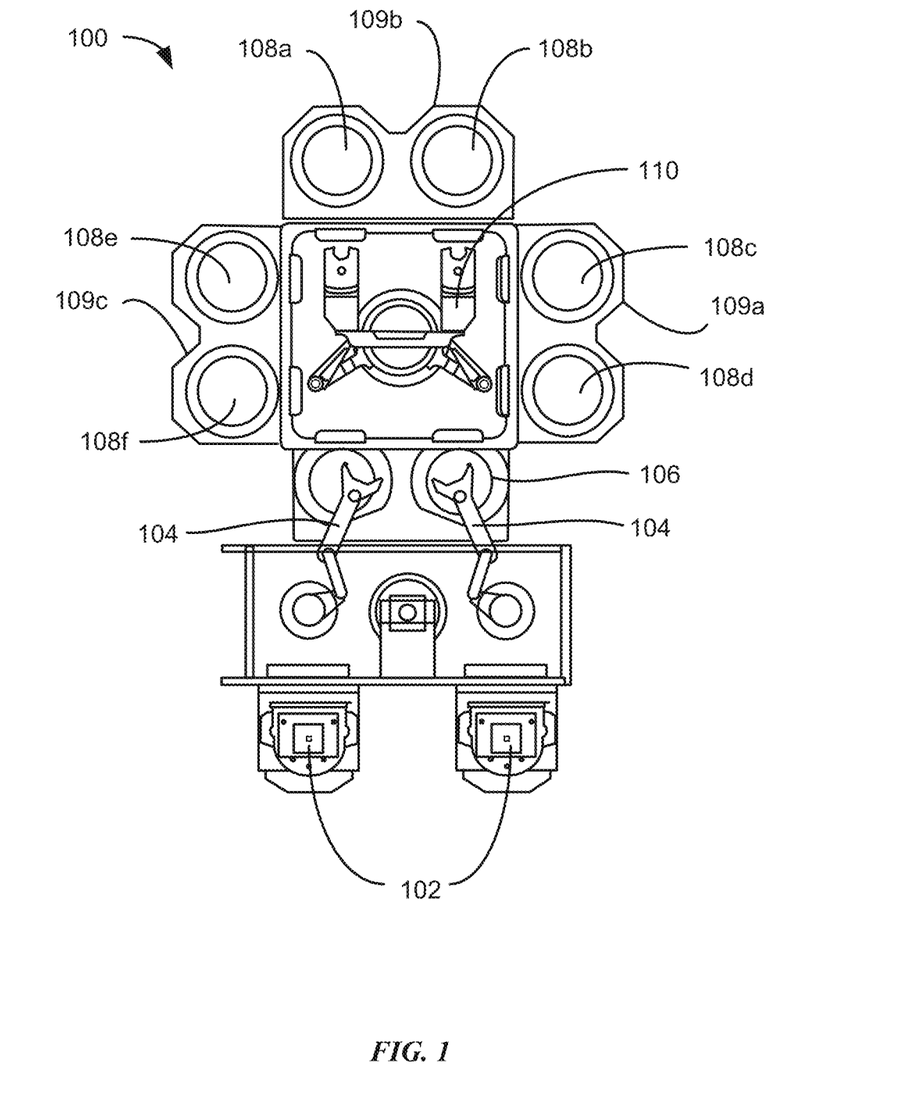
FIG. 1 shows a top plan view of an exemplary processing system according to some embodiments of the present technology.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
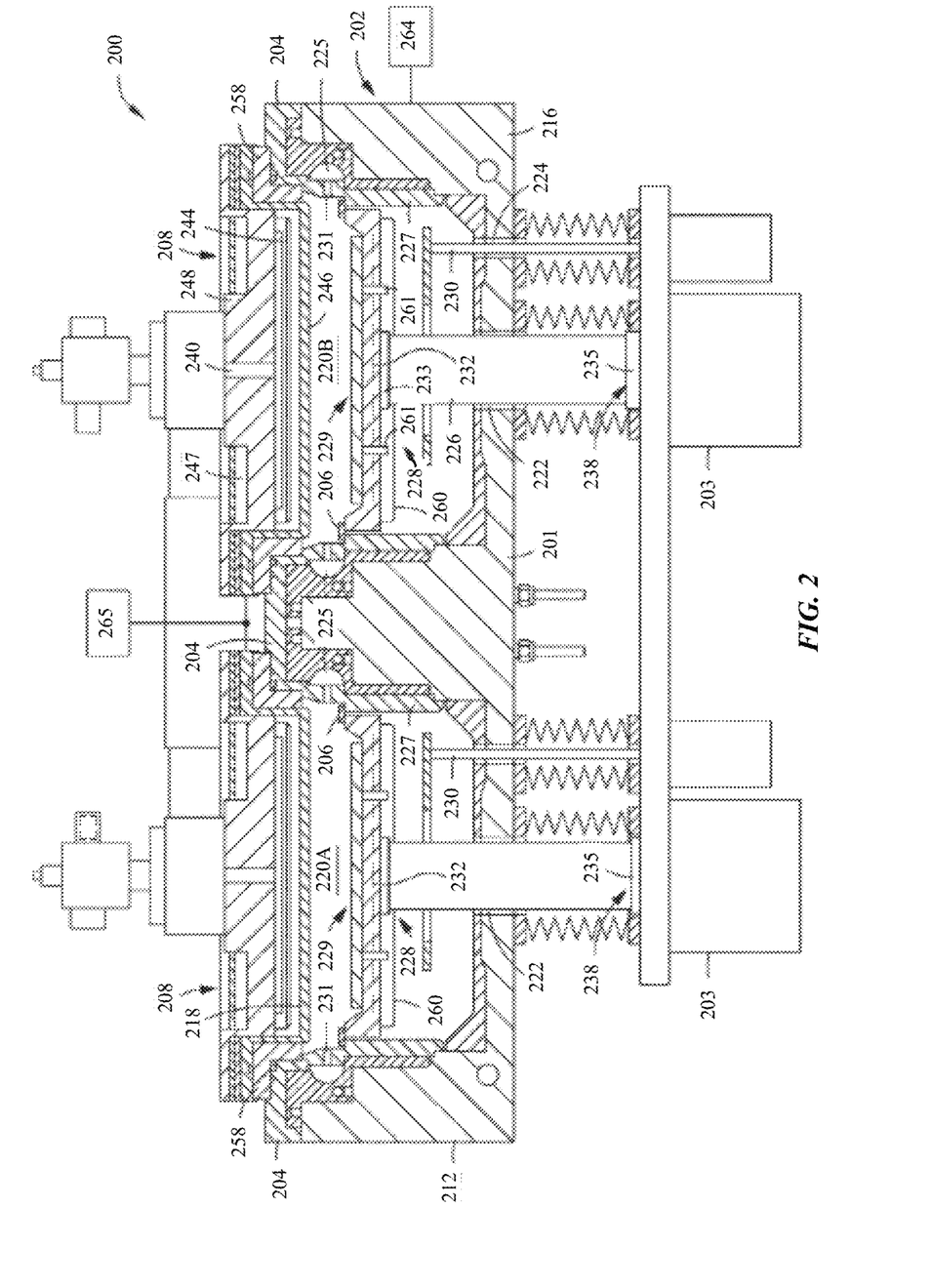
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include faceplates or other components or assemblies according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a gas delivery assembly 218 into the processing region 220B. The gas delivery assembly 218 may include a gasbox 248 having a blocker plate 244 disposed intermediate to a faceplate 246. A radio frequency ("RF") source 265 may be coupled with the gas delivery assembly 218, which may power the gas delivery assembly 218 to facilitate generating a plasma region between the faceplate 246 of the gas delivery assembly 218 and the pedestal 228, which may be the processing region of the chamber. In some embodiments, the RF source may be coupled with other portions of the chamber body 202, such as the pedestal 228, to facilitate plasma generation. A dielectric isolator 258 may be disposed between the lid 204 and the gas delivery assembly 218 to prevent conducting RF power to the lid 204. A shadow ring 206 may be disposed on the periphery of the pedestal 228 that engages the pedestal 228.

An optional cooling channel 247 may be formed in the gasbox 248 of the gas distribution system 208 to cool the gasbox 248 during operation. A heat transfer fluid, such as water, ethylene glycol, a gas, or the like, may be circulated through the cooling channel 247 such that the gasbox 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
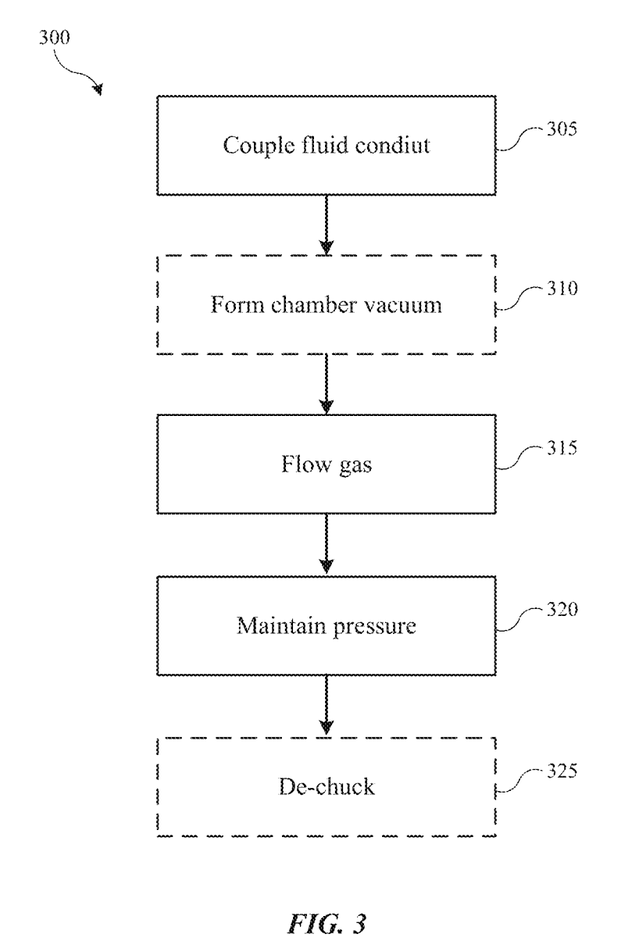
FIG. 3 shows exemplary operations in a method of semiconductor processing according to some embodiments of the present technology.

FIG. 3 shows exemplary operations in a method 300 of semiconductor processing according to some embodiments of the present technology. The method may be performed in a variety of processing chambers, including processing chamber 200 described above. Method 300 may include a number of optional operations, which may or may not be specifically associated with some embodiments of methods according to the present technology. For example, many of the operations are described in order to provide a broader scope of the process and system, but are not critical to the technology, or may be performed by alternative methodology as would be readily appreciated. Method 300 may describe operations shown being performed in a schematic system illustrated in FIG. 4, the components of which will be described in conjunction with the operations of method 300. It is to be understood that the figures illustrate only partial schematic views, and a substrate may contain any number of additional materials and features having a variety of characteristics and aspects as illustrated in the figures. For example, semiconductor processing system 400 may include any of the features, components, or characteristics discussed previously.

Figure 4:
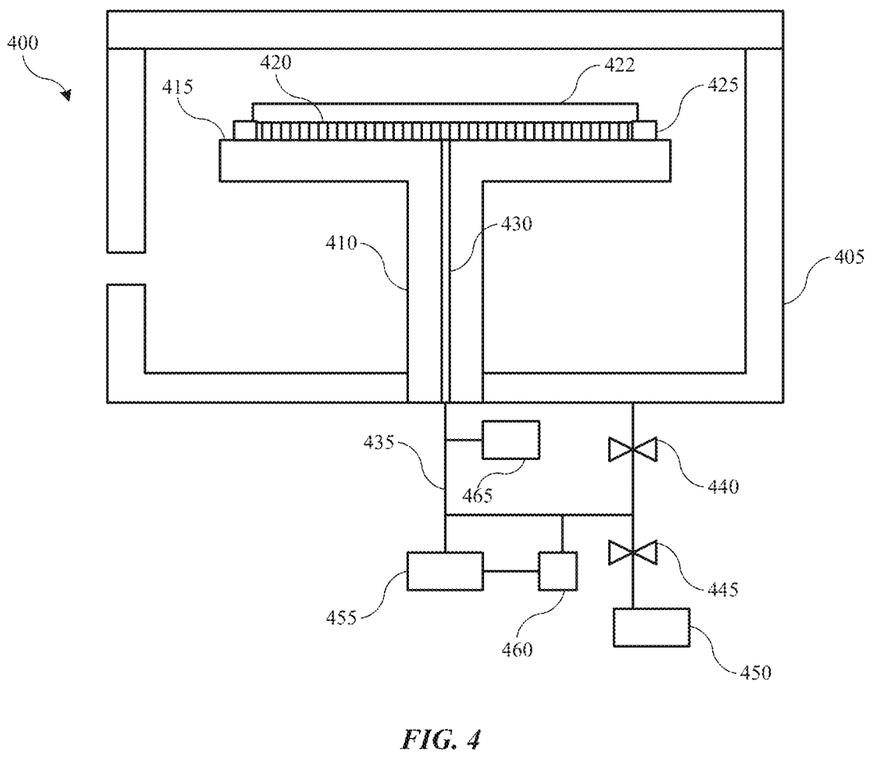
FIG. 4 shows a schematic cross-sectional view of an exemplary processing system according to some embodiments of the present technology.

Method 300 may include additional operations prior to initiation of the listed operations. For example, additional processing operations may include forming structures on a semiconductor substrate, which may include both forming and removing material. Prior processing operations may be performed in the chamber in which method 300 may be performed, or processing may be performed in one or more other processing chambers prior to delivering the substrate into the semiconductor processing chamber in which method 300 may be performed. Regardless, method 300 may optionally include delivering a semiconductor substrate to a processing region of a semiconductor processing chamber, such as processing chamber 200 described above, or other chambers that may include one or more components as described above. For example, a partial processing system 400 may include a substrate processing chamber 405. Some aspects of the processing chamber may not be illustrated for simplicity of explanation, but any number of components of chamber 200 described above may be included.

The processing chamber may illustrate a semiconductor processing region of the processing chamber, which may include a substrate support 410 extending into the processing chamber 405. The substrate 229 or substrate 422 may be deposited on substrate support 410, which may be a pedestal such as substrate support 228, and which may reside in a processing region of the chamber, such as processing volume 220 described above. An exemplary substrate 422 is illustrated in FIG. 4 on substrate support 410 within processing system 400.

The substrate support 410, or the platen 415 of the substrate support, may be any number of materials on which substrates may be disposed. The substrate support may be or include a ceramic material, for example oxides or nitrides. Suitable oxides may be or include aluminum oxide and suitable nitrides may be or include aluminum nitride or silicon nitride, and may further include metal materials, or any number of combinations of these materials, which may be the substrate support 410, or materials formed within or on substrate support 410. In some embodiments, substrate support 410 may include electrodes and/or heating elements embedded within the substrate as previously described. In some embodiments the substrate support may define one or more protrusions 420 on which the substrate may be seated. The protrusions may extend from a first surface of the platen portion of the substrate support, where a second surface opposite the first surface may be where a stem couples with the platen to form the pedestal.

In some embodiments the substrate support may be a vacuum chucking support, and may include one or more components for vacuum chucking or electrostatic chucking. For example, a sealing band 425 may extend at a periphery of the substrate, and may allow a vacuum to be enacted between the substrate support and the substrate. The substrate support may define one or more apertures through the first surface of the platen 415, which may be fluidly accessible from a fluid conduit 430 running through the shaft. The fluid conduit 430 may be fluidly coupled with a fluid line 435 extending from the shaft of the substrate support outside of the chamber. In some embodiments, the fluid conduit and the fluid line may be a continuous fluid line.

Conventional vacuum chucking may include only a binary operation for chucking and de-chucking the substrate from the support. For example, the vacuum line, such as the fluid conduit and/or fluid line, may be coupled between two locations: the chamber, and the system foreline. When the substrate is to be chucked, the line may be coupled with the foreline, and when the substrate is to be de-chucked, the line may be coupled with the chamber. This binary operation may limit any control over substrate backside pressure. For example, the system foreline is typically coupled at low pressure, which may be several mTorr or less. This may produce a strict vacuum condition at the substrate, which may substantially remove air or gas between the substrate and the substrate support. The area between the substrate and the substrate support may be mostly free space, with the protrusions consuming less than or about 75% of the volume, less than or about 50% of the volume, less than or about 25% of the volume, or less. Accordingly, when a strong vacuum is pulled in the region, heat transfer within the area may be reduced. This may increase temperature discrepancies at the wafer as heat may not distribute as uniformly through the air gap. The present technology may improve the heat uniformity by increasing the pressure at the backside of the substrate. By increasing the pressure, an increased air mass may be provided, which may produce an increased molecular mass for heat transfer within the gap.

For example, system 400 may couple fluid line 435 with the chamber, through a valve 440, and may couple the valve to the foreline through a valve 445, which may provide access to the vacuum pumping system 450. Accordingly, the fluid line may be fluidly accessible with each of the chamber and the system foreline. During a chucking operation, valve 440 may be closed, while valve 445 may be opened, which may draw a vacuum on the fluid line and substrate seated on the support. If no other adjustments are performed, the backside pressure may be below or about 2 Torr, below or about 1 Torr, or lower, where the foreline pressure may be below or about 1 Torr, below or about 100 mTorr, below or about 50 mTorr, or less. However, the present technology may include a pressure controller 455, which may be fluidly coupled with the fluid line 435.

The pressure controller 455 may control delivery of a gas from a gas source 460 into the fluid line with one or more gas injection lines coupling the gas source 460 with the fluid line. By delivering gas into the fluid line, which may be exhausted to the foreline during a chucking operation, the backside pressure may be increased, as the additional fluid flow may limit the vacuum effect on the substrate backside. By increasing the flow rate from the gas source, a pressure at the wafer backside may be increased. This may allow increased pressure to be maintained at the wafer backside, which may increase thermal uniformity at the substrate.

Method 300 may be performed utilizing system 400, or any other system incorporating components of the present technology, and may include coupling fluid conduit 430 within the substrate support to the system foreline at operation 305, which may provide vacuum chucking of substrate 422 to the substrate support. The vacuum chucking operation may include actuating valve 445, as well as any other system valves to provide a flow path between the substrate support and the pumping system 450, which may produce a vacuum in the fluid conduit. During a processing operation a vacuum may also be formed within the processing chamber, such as at optional operation 310. The processing pressure may be greater than the foreline pressure, and may be greater than or about 2 Torr, greater than or about 5 Torr, greater than or about 10 Torr, greater than or about 15 Torr, greater than or about 20 Torr, greater than or about 25 Torr, greater than or about 30 Torr, or higher.

Controller 455 may be utilized to provide a gas from gas source 460 to be delivered into the fluid line 435 and/or fluid conduit 430 at operation 315. As the flow rate of gas delivered may be increased by the flow controller, the pressure at the backside of the substrate may be increased. The controller may maintain a particular pressure setpoint at the backside of the substrate based on a flow rate being delivered through the system to the foreline. Accordingly, once the setpoint has been achieved, which may be any pressure higher than the pressure in the system foreline, the flow rate of the gas may be maintained at operation 320 to maintain the backside pressure during substrate processing within the chamber. Additionally, the pressure controller may adjust the gas flow rate higher or lower in order to maintain a pressure setpoint to accommodate any fluctuations. Once processing has been completed, the gas flow may be halted, and the fluid line may be coupled with the chamber by actuating valve 440, among any other valves, which may relieve vacuum from the substrate backside and de-chuck the substrate at optional operation 325.

As noted, the pressure at the substrate backside may be maintained at any pressure, and depending on the chamber pressure during processing, the backside pressure may be maintained between the foreline pressure and the chamber pressure by delivering gas flow into the fluid lines. The gas delivered may be an inert gas or air in embodiments. As the pressure at the substrate backside is increased, pressure uniformity may be improved over full vacuum conditions. Accordingly, in some embodiments the substrate backside pressure may be maintained at greater than or about 1 Torr, and may be maintained at greater than or about 2 Torr, greater than or about 3 Torr, greater than or about 4 Torr, greater than or about 5 Torr, greater than or about 6 Torr, greater than or about 7 Torr, greater than or about 8 Torr, greater than or about 9 Torr, greater than or about 10 Torr, greater than or about 15 Torr, greater than or about 20 Torr, greater than or about 25 Torr, greater than or about 30 Torr, or higher. In chamber processes utilizing vacuum chucking, the processing chamber may be maintained at a pressure greater than the substrate backside pressure to maintain chucking. In chamber processes utilizing electrostatic chucking, the chamber pressure may be similar, greater than, or less than the backside pressure.

However, as the pressure continues to increase, the pressure may impact chucking. For example, when a substrate is vacuum chucked against a seal band, the seal may not be completely hermetic. As the backside pressure is increased, leakage may occur from the wafer through any unsealed portions, which may affect substrate temperature at a region about the leak. Accordingly, as pressure increases, the thermal uniformity may decrease. Consequently, the backside pressure may be maintained below or about 30 Torr, below or about 25 Torr, below or about 20 Torr, below or about 15 Torr, or less. The flow rate from the gas source 360 may be any flow to maintain a setpoint pressure or flow rate, and in some embodiments the gas flowed into the fluid line may be flowed at a rate of greater than or about 10 sccm, and may be flowed at a rate of greater than or about 15 sccm, greater than or about 20 sccm, greater than or about 25 sccm, greater than or about 30 sccm, greater than or about 35 sccm, greater than or about 40 sccm, greater than or about 45 sccm, greater than or about 50 sccm, greater than or about 75 sccm, greater than or about 100 sccm, up to one or more liters of fluid, or higher.

In some embodiments, by controlling the backside pressure, the localized temperature at the substrate may be controlled to deviate from other pedestal location temperatures by less than or about 4° C., less than or about 3° C., less than or about 2° C., less than or about 1° C., less than or about 0.8° C., less than or about 0.6° C., less than or about 0.5° C., less than or about 0.4° C., less than or about 0.3° C., or less. The uniformity may depend on the desired temperature reduction and other system configurations, such as protrusion configurations, as will be described below.

In some chamber systems a fluid line from a chamber to a pressure controller may be quite long, which may not provide a measurement of the pressure at the substrate support, or may cause a delay in readings when the pressure at the backside of the substrate changes. Accordingly, while the pressure controller 455 may provide pressure readings wherever it may be coupled with the fluid lines, in some embodiments a manometer 465 may be coupled proximate the processing chamber. The manometer may not be coupled within the processing chamber, but may be coupled with the fluid line adjacent where the fluid line enters the shaft of the pedestal, which may provide more accurate measurements of substrate backside pressure. The manometer may be communicatively coupled with the pressure controller 455, which may adjust gas flow rates based on readings from the manometer, and to facilitate maintaining a pressure setpoint at the manometer. Any type of pressure controller may be utilized, which may include a controller based on a pressure being measured or delivered from a manometer, and which may include a controller operative to adjust a flow rate from a gas source. In some embodiments a mass flow controller may also or alternatively be utilized, which may control fluid delivery, and may be coupled with a manometer. The mass flow controller may be operated to adjust flow rates in reaction to measurements provided by the manometer, and to maintain a pressure setpoint at the manometer.

The present technology may also modify the substrate support to adjust the gas volume between the support and the substrate. As previously explained, the volume may be defined between protrusions extending across the surface of the substrate support. By adjusting the height of the protrusions, the gap between the substrate and the substrate support may be reduced, which may increase thermal coupling between the components. To adjust the height of protrusions, while maintaining a uniform substrate support surface, the present technology may adjust the height of the first surface from which the protrusions extend. This may allow a controlled gap height in embodiments of the present technology, while maintaining the substrate support surface provided by the protrusions.

FIGS. 5A-5D show exemplary protrusion structures for substrate supports according to some embodiments of the present technology. The figures may illustrate a platen portion of a substrate support as previously described, and may illustrate a number of protrusion patterns to adjust a gap between the substrate and the substrate support in some regions across the substrate.

It is to be understood that the illustrations are examples only, and any number of adjustments may be performed and are similarly encompassed by the present technology. The substrate supports illustrated may be incorporated with any of the systems previously described, as well as any other systems that may benefit from the configurations discussed. The substrate supports may include any of the features, characteristics, or components previously described. These gap adjustments may be performed based on processing results where deposition may not be uniform across the substrate.

Figure 5A:
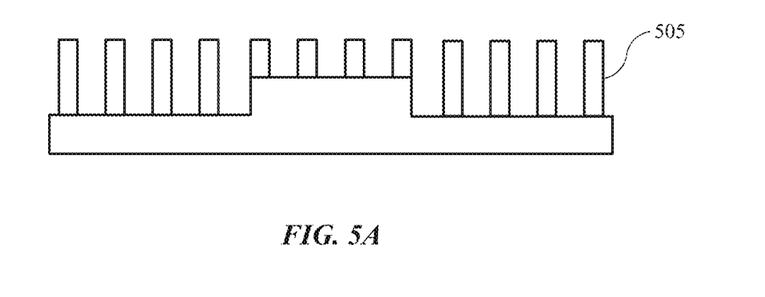
FIGS. 5A-5D show exemplary protrusion structures for substrate supports according to some embodiments of the present technology.

FIG. 5A shows a first pattern where the gap height may be reduced at a central region of the substrate support. Protrusions 505 may be defined by the substrate support, and may extend from a first surface of the substrate support to define a substrate support surface. As illustrated, the protrusions may all extend to a similar height, but the first surface of the substrate support may be characterized by a raised portion at a central region or location across the substrate support. This may reduce the gap height between the substrate and the first surface within the region, which may increase thermal conductivity between the substrate support and the substrate, and may increase a temperature of the substrate within the region. For example, some processing may be characterized by a center-low deposition, which may be due to any number of system components or configurations. By reducing the gap height within this central region, the temperature may be increased, which may increase deposition within the region. Accordingly, the present technology may reverse tune non-uniformity issues for particular processes.

Figure 5B:
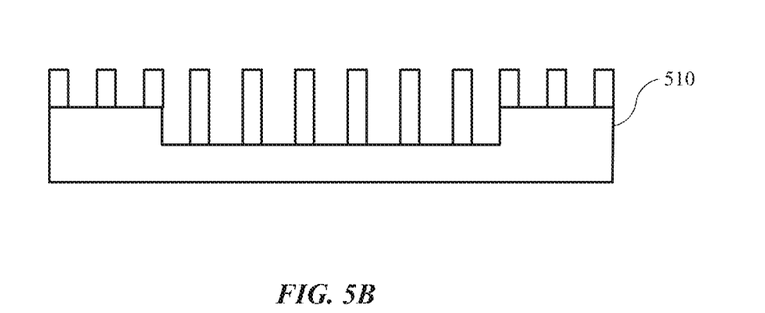
Figure 5C:
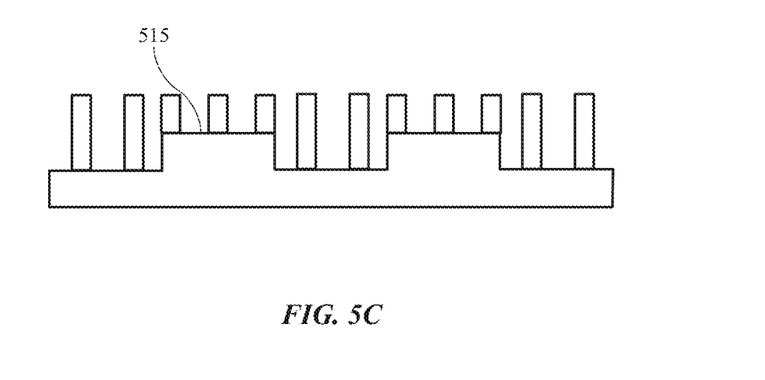
Figure 5D:
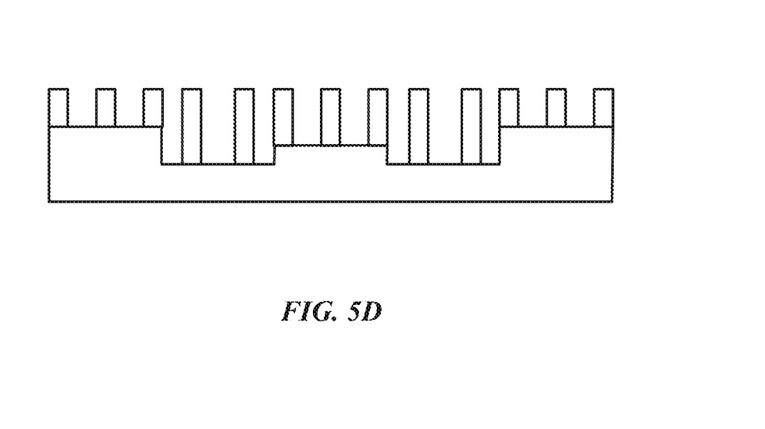

Depending on the nature of the non-uniformity, any number of additional adjustments may similarly be made. For edge-low deposition or removal issues, an annular raised portion 510 may be formed about an edge region of the substrate support as illustrated in FIG. 5B. Similarly, an annular raised portion may be formed at any location radially outward of a center of the substrate support, such as illustrated in FIG. 5C, where a raised annular section 515 may be formed to accommodate a mid-range deposition issue. The raised portions may also be combined, such as illustrated in FIG. 5D, where a center region may be raised, as well as an edge region. This configuration may accommodate processing where mid-range deposition is higher than center or edge regions. As also shown in the figure, the height of different regions may also be adjusted, such as if the center-low issue may not be as prominent as the edge-low issue, for example. Any number of other adjustments may be formed, where raised portions may extend to any radial length or height to accommodate non-uniformity of processing.

Figure 6A:
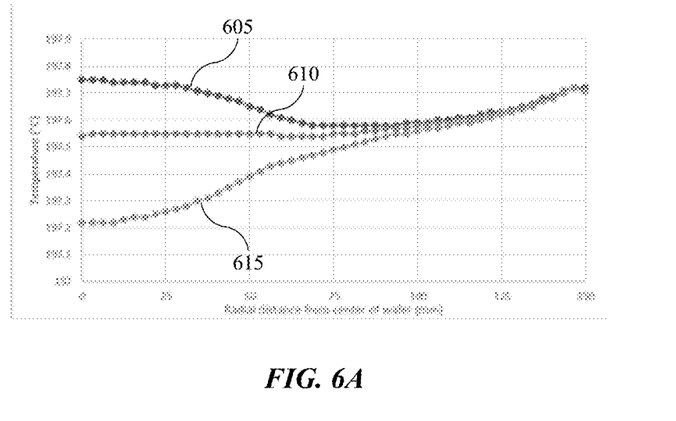
FIGS. 6A-6C show charts illustrating an effect of backside pressure with protrusion height on substrate temperature according to some embodiments of the present technology.
Figure 6B:
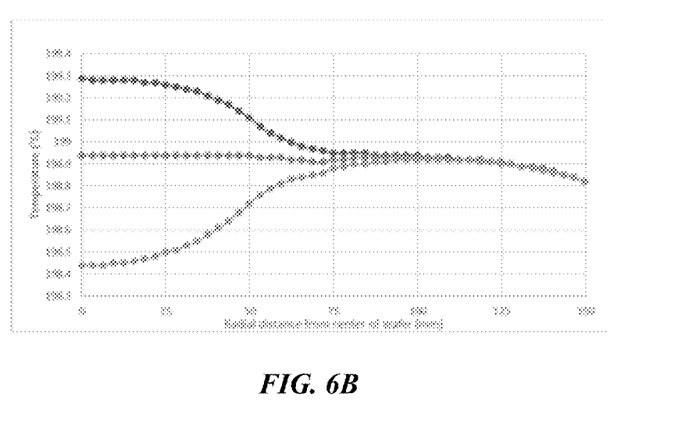
Figure 6C:
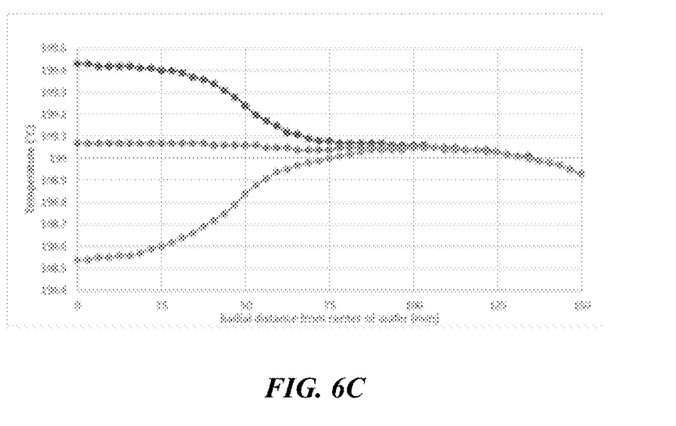

The gap height may also be affected by the substrate backside pressure, and thus in some embodiments the protrusion adjustments may be included with increased backside pressure systems and methods as previously described. FIGS. 6A-6C show charts illustrating an effect of backside pressure with protrusion height on substrate temperature at different radial distances along a substrate according to some embodiments of the present technology. FIG. 6A shows the effect of different protrusion heights at a first backside gas pressure, which may be a low pressure of below or about 5 Torr. As shown in the figure, line 605 illustrates where the gap height at a center of the substrate support is less than at radial distances outward, such as with a substrate support structure similar to that illustrated in FIG. 5A, for example. Line 610 illustrates where the gap height may be similar fully across the substrate, and line 615 illustrates where the gap height may be greater than at outward radial distances, such as with a substrate support structure similar to that illustrated in FIG. 5B, for example.

As illustrated, the temperature about the center region may be adjusted with these modifications, although the adjustment may adjust temperature less than or about one degree Celsius, such as less than or about 0.5° C. FIG. 6B illustrates the same substrate support configurations but at a higher backside pressure, such as between about 10 Torr and about 20 Torr. As illustrated, a similar effect is produced, but the temperature difference provided is greater than 0.5° C., such as greater than or about 0.9° C. Accordingly, a greater effect on deposition may be afforded by increasing the backside gas pressure, such as where the non-uniformity in deposition is more pronounced. FIG. 6C illustrates the same substrate support configurations but at even higher backside pressure, such as greater than 25 Torr. As illustrated, the effect is substantially similar as at lower pressure, and as described above, the system may be more prone to leakage. Consequently, sufficient effects may be produced at pressures as previously described, while controlling leakage from the substrate support. By increasing backside pressure during substrate processing, and otherwise adjusting substrate supports as previously described, heat transfer may be improved and processing non-uniformity may be accommodated.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a gas" includes a plurality of such gases, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of semiconductor processing comprising: coupling a fluid conduit within a substrate support in a semiconductor processing chamber to a system foreline, wherein the substrate support defines a plurality of protrusions extending from a first surface of the substrate support, wherein the protrusions extend from the first surface of the substrate support to a similar height, and wherein the first surface of the substrate support is characterized by a raised portion creating a reduced gap height between two or more adjacent protrusions within the raised portion of the first surface of the substrate support,
wherein the coupling vacuum chucks a substrate with the substrate support, wherein the substrate is seated on the plurality of protrusions and the substrate support comprises a sealing band extending at a periphery of the substrate;
flowing a gas into the fluid conduit, thereby maintaining a pressure between the substrate and the substrate support at a pressure higher than a vacuum pressure drawn on the fluid conduit; and
releasing the coupling to de-chuck the substrate.

2. The method of semiconductor processing of claim 1, wherein coupling the fluid conduit to the system fore line comprises actuating a valve between the fluid conduit and the system foreline to form a vacuum in the fluid conduit.

3. The method of semiconductor processing of claim 1, further comprising: forming a vacuum within the semiconductor processing chamber to provide a processing pressure, wherein the pressure between the substrate and the substrate support is between the pressure at the system fore line and the processing pressure.

4. The method of semiconductor processing of claim 3, wherein the pressure between the substrate and the substrate support is maintained between about 1 Torr and about 30 Torr.

5. The method of semiconductor processing of claim 1, wherein a manometer is coupled in the fluid conduit proximate the semiconductor processing chamber.

6. The method of semiconductor processing of claim 5, wherein the manometer is communicatively coupled with a controller configured to control a flow rate of the gas being flowed into the fluid conduit.

7. The method of semiconductor processing of claim 6, further comprising adjusting the flow rate of the gas being flowed into the fluid conduit to maintain a pressure setpoint at the manometer.

8. The method of semiconductor processing of claim 6, wherein the controller comprises a mass flow controller coupled with an inert gas source.

9. The method of semiconductor processing of claim 1, wherein the raised portion is located at a central region of the substrate support.

10. The method of semiconductor processing of claim 1, wherein the raised portion comprises an annular region located radially outward of a center of the substrate support.

11. A semiconductor processing system comprising:
a semiconductor processing chamber;
a foreline fluidly coupling the semiconductor processing chamber with a pump; a substrate support disposed within the semiconductor processing chamber, the substrate support comprising a first surface configured to contact a substrate, wherein the first surface defines an aperture through the substrate support, and wherein the substrate support defines a plurality of protrusions extending from the first surface of the substrate support, wherein the protrusions extend from the first surface of the substrate support to a similar height, and wherein the first surface of the substrate support is characterized by a raised portion creating a reduced gap height between protrusions within the raised portion of the first surface of the substrate support; a shaft extending from the substrate support and providing fluid access to the aperture defined through the substrate support;
a fluid line extending from the shaft to a pressure controller, wherein the fluid line is fluidly accessible between the semiconductor processing chamber and the foreline; and
a gas injection line fluidly coupling a gas source with the fluid line, wherein the pressure controller is configured to deliver gas from the gas source through the gas injection line into the fluid line.

12. The semiconductor processing chamber of claim 11, wherein a manometer is coupled in the fluid line proximate the semiconductor processing chamber.

13. The semiconductor processing chamber of claim 11, wherein the raised portion is located at a central region of the substrate support.

14. The semiconductor processing chamber of claim 13, wherein the raised portion is a first raised portion, and wherein the first surface of the substrate support is characterized by a second raised portion comprising an annular region located radially outward of the central region of the substrate support.

* * * * *